United States Patent
Denham et al.

(10) Patent No.: US 6,903,598 B2
(45) Date of Patent: Jun. 7, 2005

(54) STATIC, LOW-VOLTAGE FUSE-BASED CELL WITH HIGH-VOLTAGE PROGRAMMING

(75) Inventors: Martin Spence Denham, Bend, OR (US); Mohsen Alavi, Portland, OR (US); Kaizad Rumy Mistry, Lake Oswego, OR (US); Patrick John Ott, Hillsboro, OR (US); Rachael Jade Parker, Forest Grove, OR (US); Paul Gregory Slankard, Aloha, OR (US); Wenliang Chen, Portland, OR (US)

(73) Assignee: Intel Corporation, Santa Clara, CA (US)

(*) Notice: Subject to any disclaimer, the term of this patent is extended or adjusted under 35 U.S.C. 154(b) by 93 days.

(21) Appl. No.: 10/155,512

(22) Filed: May 24, 2002

(65) Prior Publication Data
US 2003/0218492 A1 Nov. 27, 2003

(51) Int. Cl.[7] .......................... H01H 37/76; H01H 85/00
(52) U.S. Cl. ....................................................... 327/525
(58) Field of Search ................................ 327/525, 526; 365/225.7

(56) References Cited

U.S. PATENT DOCUMENTS

| | | | | |
|---|---|---|---|---|
| 5,731,733 A | * | 3/1998 | Denham | 327/525 |
| 5,959,445 A | | 9/1999 | Denham | 323/315 |
| 6,054,893 A | * | 4/2000 | Singh | 327/525 |
| 6,208,549 B1 | * | 3/2001 | Rao et al. | 365/96 |
| 6,417,720 B1 | * | 7/2002 | Denham | 327/525 |
| 2003/0141921 A1 | * | 7/2003 | Liu | 327/525 |

* cited by examiner

Primary Examiner—Quan Tra
(74) Attorney, Agent, or Firm—Marger Johnson & McCollom, PC

(57) ABSTRACT

A fuse-based cell. The fuse-based cell includes a fuse with a programming device electrically coupled to the fuse to program the fuse. A sensing device is electrically coupled to the fuse to sense a programming state of the fuse. A clamping device is electrically coupled to the sensing device to control voltages across the sensing device during programming. A pass device is electrically coupled to the sensing device to control voltages across the sensing device during sensing.

18 Claims, 4 Drawing Sheets

STATIC, LOW-VOLTAGE FUSE-BASED CELL WITH HIGH-VOLTAGE PROGRAMMING

BACKGROUND

1. Field

This disclosure relates to fuse-based cells, more particularly to those fuse-based cells programmable with high voltages.

2. Background

Fuse-based cells have many applications in semiconductor device manufacture. The cells can permanently store data, for example, where a burned fuse represents a "1" and an unburned fuse represents a "0." Similarly, fuses can form permanent connections on integrated circuits after they are manufactured. A sensing circuit typically determines the state of the fuse. These sensing circuits typically detect a change in the resistance of the fuse device from a low value for unburned fuses to a high value for burned fuses.

However, advances in semiconductor manufacturing technology have decreased the resistance of fuses after they have been burned, referred to as post-burn resistance. Similarly, the operating voltages of most semiconductor devices have been reduced in pursuit of lower power consumption. While higher burning voltages move the post-burn resistance to a high level, the higher voltages may damage semiconductor devices designed to operate at lower voltages.

Therefore, it would be useful to have the ability to use higher burning voltages for fuse-based devices, while providing protection for devices that operate at lower voltages.

BRIEF DESCRIPTION OF THE DRAWINGS

The invention may be best understood by reading the disclosure with reference to the drawings, wherein.

DETAILED DESCRIPTION OF THE EMBODIMENTS

Figure 1:
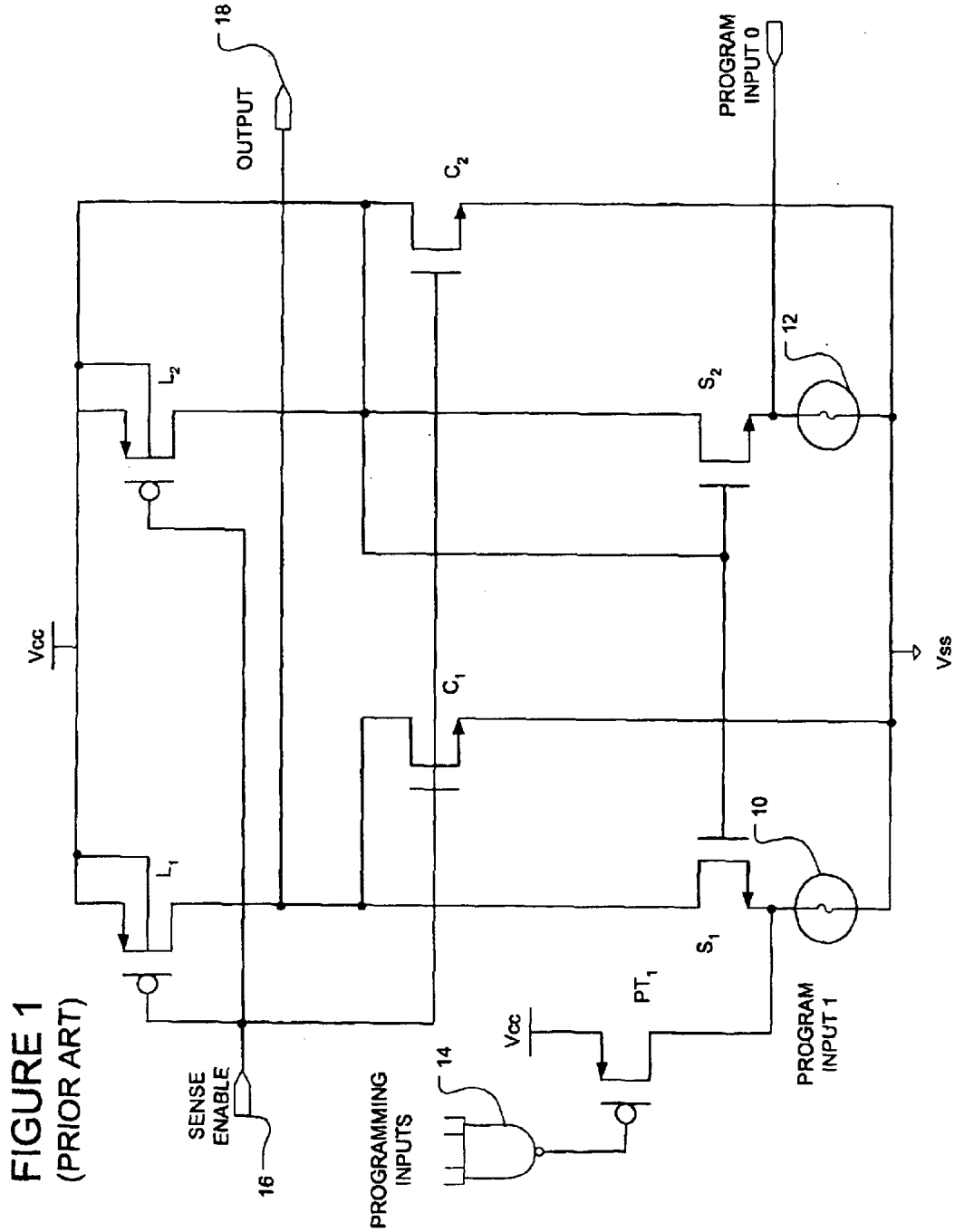
FIG. 1 shows an embodiment of a programming circuit for a fuse-based device, in accordance with the prior art.

FIG. 1 shows an embodiment of a programming circuit for a fuse-based device, in accordance with the prior art as discussed in U.S. Pat. No. 5,959,445 issued Sep. 28, 1999. The example shown is a 'differential' embodiment, where the difference is detected based upon the programming of one of the two fuses. In FIG. 1, a programming transistor PT1 is a p-channel transistor. The source is coupled to Vcc, which is the voltage used in this example to program either the set fuse 10 or the clear fuse 12. The programming device and circuitry for programming the clear fuse 12 is not shown in this drawing.

Logic circuitry, such as the NAND gate shown, is couple to the gate of the transistor PT1 to control the programming circuit. If only one input is used, the logic circuitry is not necessary, as the input line could be coupled directly to the gate of the transistor. Any input received, either through the logic circuit or directly, that cause the signal at the gate of the transistor PT1 to be low turns the transistor PT1 on. This will cause current to flow through the fuse 10, coupled to the output of PT1. This programs the set fuse. A similar operation may be implemented to program the clear fuse 12 instead of the set fuse 10.

Once programmed, the state of the fuse must be determined. The sensing circuit includes a sensing device S1, with its source couple to the terminal of the set fuse 10. The drain of S1 is coupled to the drain of load device L1 and the drain of clamping device C1. In addition, the output node 18, which is used to determine the final result of the fuse state, is coupled to the drain of S1.

The two sensing devices S1 and S2 have their gates coupled together. Sensing device S2 also has its drain coupled to a reference voltage output VREF. This establishes a current mirror between the first and second branches of this circuit. The sensing device S1, clamping device C1, load device L1, programming device PT1 and set fuse 10 are all included in the first, or set, branch of the circuit. The sensing device S2, clamping device C2, load device L2, a programming device not shown and the clear fuse 12 are all included in the second, or clear, branch of the circuit.

When the sense enable signal 16 is high, the two load devices L1 and L2 are off, and there is no current flow between the two branches. The clamping devices C1 and C2 turn on, and cause the output voltage on the output node 18 to clamp to Vss. This brings the output to a known voltage when the circuit is off. When sense enable 16 is low, L1 and L2 turn on and a current path between the supply voltage Vcc and S2 is created. The gate of S2 is pulled up, causing it to conduct. This affects the voltage at VREF.

For purposes of this description, a logical '1' will be assumed if the set fuse is burned and a logical '0' will be assumed if the clear fuse is burned. The voltage level at output node 18 determines the logic state. If the output voltage is within one range, it is deemed to be a 1, if within another range, it is deemed to be a 0. The ranges are determined by the nature of the devices used.

If the set fuse is burned, it will have higher resistance than the clear fuse. There is essentially no current flow in the set branch of the circuit, including none through the sensing device S1. Load device L1 then pulls the output node up to a high state, approximately equal to Vcc. If the post-burn resistance is close to that of the unburned clear fuse, it is possible that some current may flow through S1. However, the gates of S1 and S2 are coupled together and there is a higher potential on the source of S1 because of the burned fuse. This causes the range of the gate-to-source voltage Vgs on S1 to be very close, which reduces the current through S1. L1 will then operate to pull the output node voltage high.

Similarly, if the clear fuse is burned, there is essentially no current flow through the clear branch. The reference voltage VREF is pulled high by the load device L2. The gate of S1 rises to Vcc. The current in the first branch is therefore increased and the voltage on the output node drops low, to approximately Vss.

Figure 2:
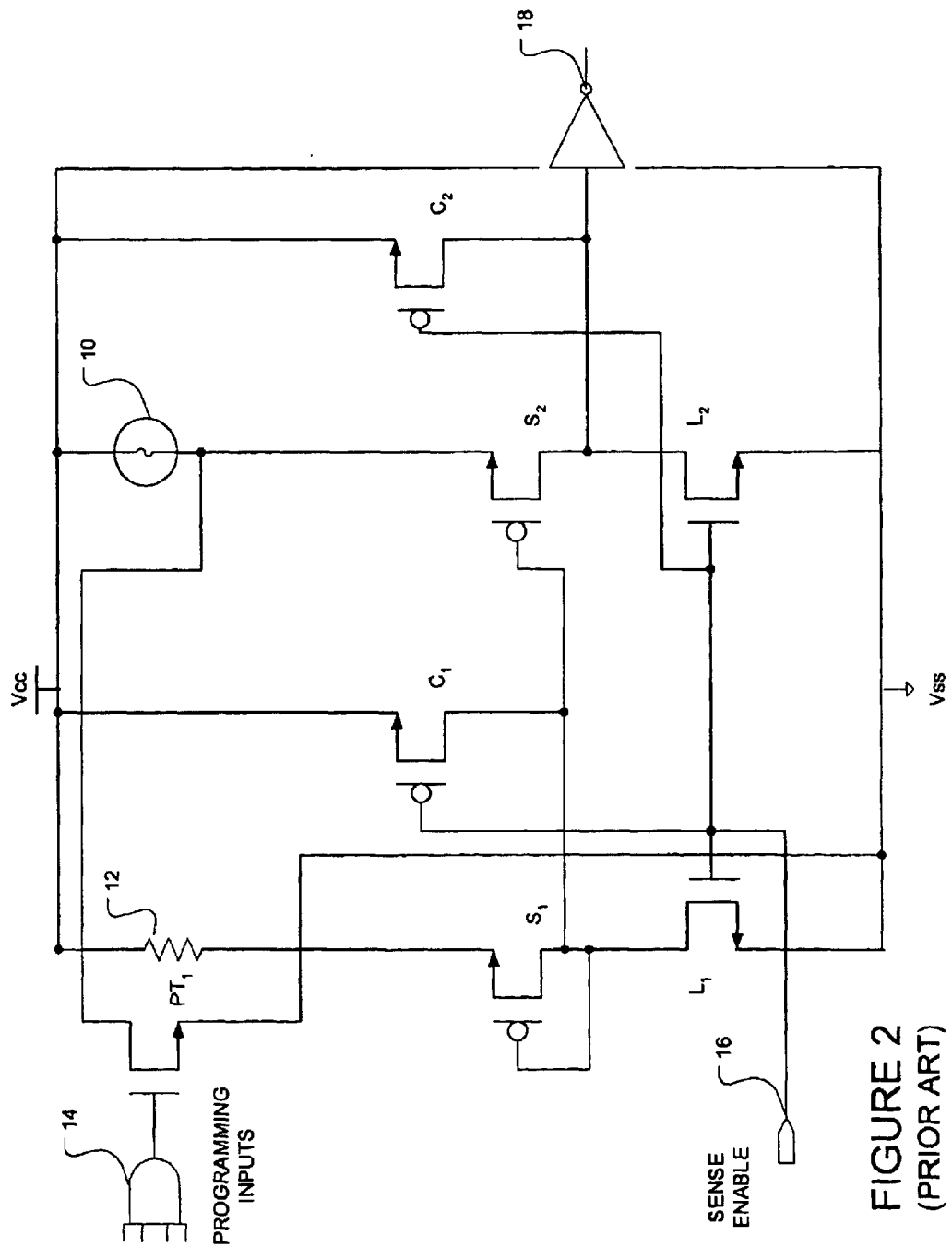
FIG. 2 shows a complimentary embodiment of a programming circuit for a fuse-based device, in accordance with the prior art.

FIG. 2 shows the opposite complimentary metal oxide semiconductor (CMOS) arrangement for a single-ended version of the circuit of FIG. 1. In FIG. 1, p-channel devices performed the programming and n-channel devices performed the sensing. In FIG. 2, n-channel programming and p-channel sensing has an advantage because the n-channel programming transistors have a decreased cell size. In addition, FIG. 1 shows a differential circuit, while FIG. 2 is a non-differential, or single-ended, circuit. This has advantages when comparing embodiments of the invention to the prior art.

However, as discussed previously, this circuit suffers from the same disadvantage of the output being marginal, where the output is not clearly either a 1 or a 0. This marginal output results from a small difference between the post-burn resistance and the unburned resistance of the fuses. Increasing the programming voltage applied to the fuse may increase this difference, but the higher voltages may damage other parts of the circuit.

Figure 3:
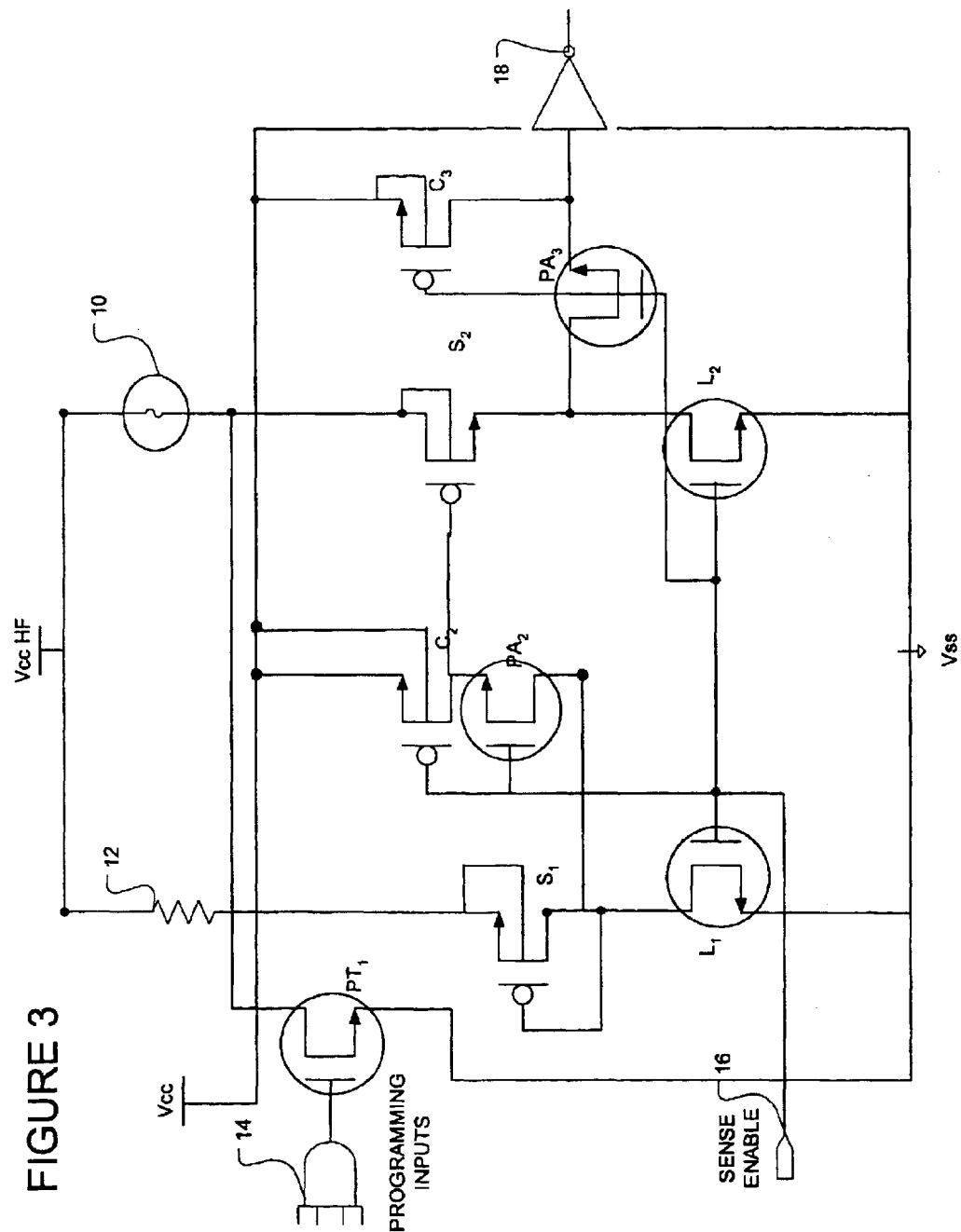
FIG. 3 shows an embodiment of a high-voltage programming circuit for a fuse-based device, in accordance with the invention.

An embodiment of a single-ended, or 'non-differential' fuse-based circuit is shown in FIG. 3. This embodiment uses VdNMOS devices, designated by a circle, for programming and protection of the non-high-voltage devices, although any other transistors that allows higher than nominal voltage could also be used. In one embodiment, these high-voltage devices are also asymmetric, in that their sources and drains cannot be reversed. Because of the high-voltage devices, the circuit has two levels of voltage supply, Vcc and VccHF. In this embodiment, the VdNMOS devices are programming transistor PT1, load transistors L1 and L2, and pass transistors PA2 and PA3. Sense transistors S1, S2 and clamping transistors C2 and C3 are not high voltage devices and require protection from the high voltage.

For ease of understanding of the embodiments of the invention, the operation of the circuit will be discussed in terms of one of three phases: the pre-programming phase; the programming phase; and the sensing phase. In the pre-programming phase, for example, the voltage supply Vcc is at a nominal voltage, such as 1.3 volts. The high-voltage supply VccHF is at a high voltage, typically two times Vcc, in this case 2.6 volts. In one embodiment, the load transistors L1 and L2 are matched high-voltage devices that can handle double the usual voltage, hence the doubling of Vcc to reach the value for VccHF.

In the pre-programming phase, the pass transistors PA2 and PA3 are off. The programming circuit and transistor PT1 drift up to VccHF. PT1 is also off, and its drain drifts up to VccHF. The pass transistors guarantee that the gate voltage of the clamp and sense transistors is at a neutral voltage and the bulk, source and drain are allowed to drift to VccHF. This does not damage these transistors, as the gate voltage is clamped to a safe voltage of Vcc, thereby protecting the sense and clamp transistors from the high voltage.

Using a mix of high-voltage transistors and nominal-voltage transistors allows for higher post-burn resistance in the fuse(s) due to the high-voltage burning of the fuse, while also providing lower power consumption. The combination of high and nominal voltage devices provides high sensitivity and lower power consumption than using all high-voltage devices.

In the non-sensing phases of programming and pre-programming, clamp transistor C3 clamp the gate of the output driver to a predictable, known value when not sensing. This ensures that there is no additional leakage current. The circuit shown in this embodiment does not support simultaneous sensing and programming.

In the programming phase, the AND gate inputs 14 are manipulated such that PT1 turns on, pulling the negative terminal of the fuse 10 to ground, which causes the fuse 10 to be burned. At the end of the burning event, the negative terminal of the fuse 10 is at or near Vss. Subsequently, the source of the sensing transistor S2 will also be at or near Vss. Additionally, the bulk of S2, electrically coupled to its source, is also pulled to a voltage at or near Vss.

During programming, claiming device C2 pulls the gate of S2 to nominal Vcc, the gate to drain and gate to source voltages are held to safe levels. Tying the bulk terminal of S2 to the source additionally guarantees that the device voltages stay within safe limits. As the source of S2 goes towards Vss, the gate is clamped to ground by clamping device C2 and the voltage across the device will never exceed 1.3 volts, or the value of Vcc. Similar precautions are taken with sensing device S1 to protect it from the high voltages.

In the sensing phase, VccHF and Vcc are set to the same voltage. This will typically equal the Vcc voltage used in the pre-programming and programming phases, but may vary as needed. The sense enable signal 16 is high, which turns on load devices L1 and L2. The pass transistors PA2 and PA3 turn on. This causes the output of PA3, pulled high by L2 to be clamped to Vcc and produce a voltage in the appropriate range for a logical 1. This causes the circuit to operate similar to that shown in the prior art, with a logical 1 being produced if the fuse if burned, and a logical 0 being produced if it is not burned.

Figure 4:
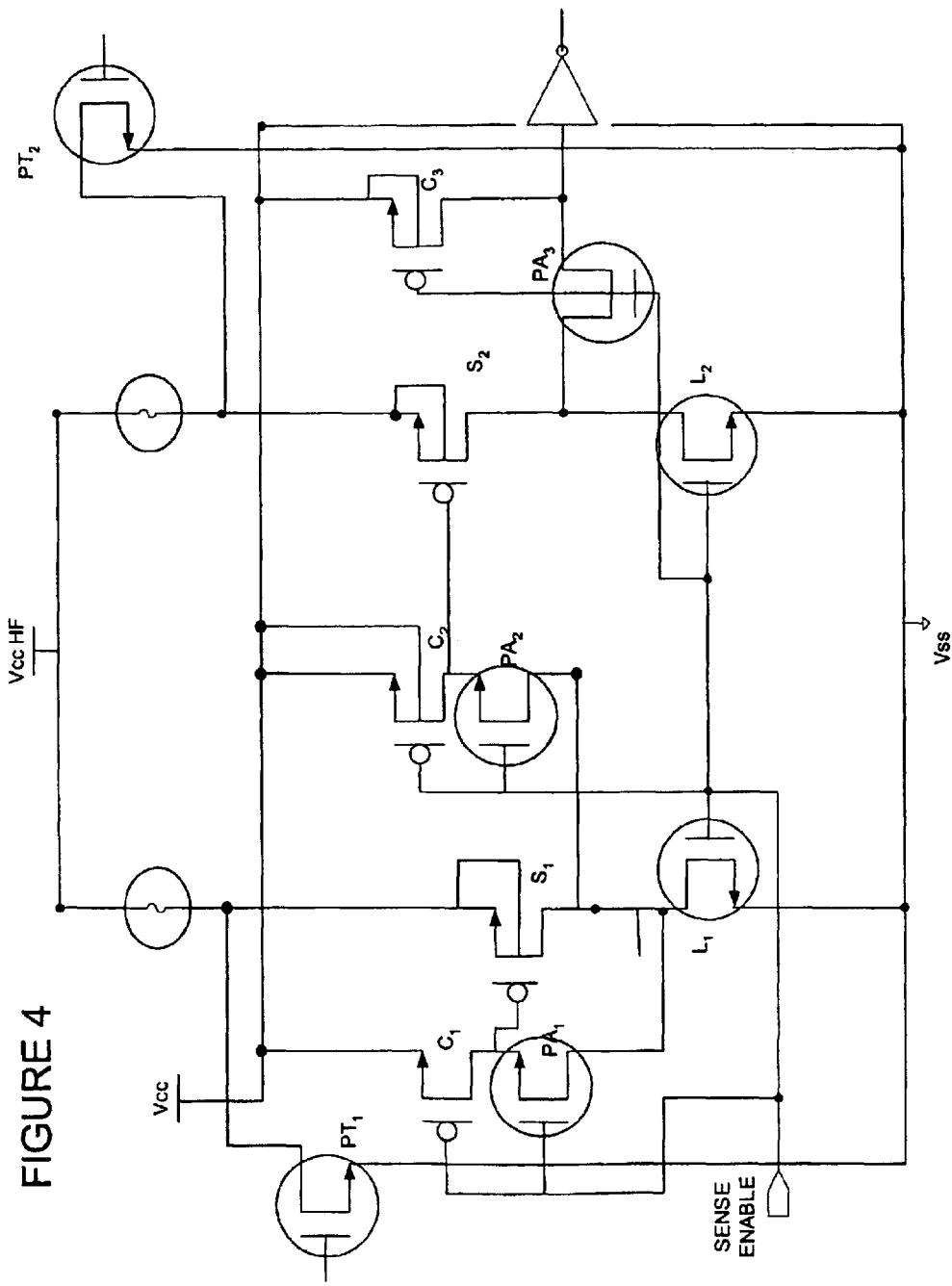
FIG. 4 shows an embodiment of a differential high-voltage programming circuit for a fuse-based device, in accordance with the invention.

FIG. 4 shows an embodiment of a differential fuse-based circuit. It is analogous to that shown in FIG. 1, but includes the high-voltage VdNMOS devices for the programming transistors PT1 and PT2, the pass transistors PA1, PA2 and PA3 and the load transistors L1 and L2. These devices operate to protect the non-high-voltage devices from the high programming voltages.

In FIG. 3, the protection circuit of PA3 and C3 were necessary to protect the sensing transistor S2. The reference 12 in FIG. 3 never had its negative terminal pulled toward Vss, therefore no protection circuit was necessary. However, in FIG. 4, the reference fuse 12 will have its negative terminal pulled towards Vss, and therefore the protection circuit of PA1 and C1 is necessary. In addition, a second programming transistor PT2 is necessary to control programming of the clear, or reference, fuse 12.

The protection from the high voltages used in programming the fuse or fuses comes from these high-voltage devices configured to block the non-high voltage devices. Additionally, tying the bulk of the sensing devices S1 and S2 to their sources also operate to protect them from the high voltages.

Thus, although there has been described to this point a particular embodiment for a method and apparatus for a programming circuit for fuse-based cells, it is not intended that such specific references be considered as limitations upon the scope of this invention except in-so-far as set forth in the following claims.

What is claimed is:

1. A fuse-based cell, comprising:

a fuse;

a programming device electrically coupled to the fuse to program the fuse using a high voltage;

a sensing device electrically coupled to the fuse to sense a programming state of the fuse;

a clamping device electrically coupled to the sensing device to control voltages across the sensing device during programming such that the voltages across the sensing device do not exceed a nominal voltage; and a pass device having a source electrically coupled to the sensing device to control voltages across the sensing device during sensing, wherein the pass device and the programming device further comprise asymmetric high-voltage devices.

2. The cell of claim 1 wherein the sensing device further comprises a sense transistor having a source, and the source of the sense transistor is electrically coupled to the fuse.

3. The cell of claim 2, wherein the sensing transistor has its bulk electrically coupled to its source.

4. The cell of claim 1 wherein the clamping device further comprises a clamping transistor and a gate of the sensing device is electrically coupled to the clamping device.

5. The cell of claim 1 wherein the device further comprises at least two load transistors.

6. The cell of claim 1 wherein the cell further comprises a second sensing device.

7. The cell of claim 6, wherein the sensing device and the second sensing device further comprise sensing transistors and the bodies of the transistors are electrically coupled to their respective sources.

8. A fuse-based storage cell, comprising:
   a first circuit branch including a first fuse;
   a second circuit branch including a second fuse, the second circuit branch being coupled to the first circuit branch in a current mirror configuration;
   a first programming device electrically coupled to the first circuit branch, wherein the first programming device is a high voltage device;
   a second programing device electrically coupled to the second circuit branch, wherein the second programming device is an asymmetric high voltage device;
   a first voltage supply providing a high voltage; and
   a second voltage supply providing a nominal voltage.

9. The cell of claim 8, wherein the first circuit branch also includes a first pass transistor, a first sensing transistor and a first load transistor.

10. The cell of claim 9, wherein the first pass transistor and the first load transistor are high voltage devices.

11. The cell of claim 8, wherein the second circuit branch also includes a second pass transistor, a second sensing transistor and a second load transistors.

12. The cell of claim 11 wherein the second pass transistor and the second load transistor are high voltage devices.

13. The cell of claim 9, wherein the first sensing transistor has its bulk electrically coupled to its source.

14. The cell of claim 11, wherein the second sensing transistor has its bulk electrically coupled to its source.

15. A fuse-based cell, comprising:
   a fuse;
   a programming device electrically coupled to the fuse to program the fuse, wherein the programming device functions at a first voltage provided from a first voltage supply;
   a sensing device electrically coupled to the fuse to sense a programming state of the fuse, wherein the sensing device operates at a second voltage provided from a second voltage supply;
   a clamping device electrically coupled to the sensing device to control voltages across the sensing device during programming, wherein the clamping device operates at the second voltage; and
   a pass device electrically coupled to the sensing device to control voltages across the sensing device during sensing, wherein the pass device operates at the first voltage.

16. The cell of claim 15 wherein the first voltage is approximately equal to twice the second voltage.

17. The cell of claim 19 wherein the programming device and the pass device are asymmetric.

18. The cell of claim 15 wherein the sensing device has its bulk electrically coupled to its source.

* * * * *

UNITED STATES PATENT AND TRADEMARK OFFICE
CERTIFICATE OF CORRECTION

| | |
|---|---|
| PATENT NO. | : 6,903,598 B2 |
| APPLICATION NO. | : 10/155512 |
| DATED | : June 7, 2005 |
| INVENTOR(S) | : Denham et al. |

It is certified that error appears in the above-identified patent and that said Letters Patent is hereby corrected as shown below:

At column 5, line 28, please replace "an asymmetric high voltage device" with --a high voltage device, asymmetric to the first programming device--

At column 6, line 30, please replace "claim 19 wherein" with --claim 15 wherein--

Signed and Sealed this

Twenty-sixth Day of December, 2006

JON W. DUDAS
*Director of the United States Patent and Trademark Office*